US006359810B1

(12) United States Patent
Gupta et al.

(10) Patent No.: US 6,359,810 B1
(45) Date of Patent: *Mar. 19, 2002

(54) PAGE MODE ERASE IN A FLASH MEMORY ARRAY

(75) Inventors: Anil Gupta, San Jose; Steven J. Schumann, Sunnyvale, both of CA (US)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/542,434

(22) Filed: Apr. 4, 2000

Related U.S. Application Data

(62) Division of application No. 09/042,244, filed on Mar. 13, 1998, now Pat. No. 6,118,705.

(51) Int. Cl.[7] ............................................. G11C 16/04
(52) U.S. Cl. .......................... 365/185.29; 365/185.12; 365/185.18
(58) Field of Search ..................... 365/185.29, 185.12, 365/185.33, 185.18

(56) References Cited

U.S. PATENT DOCUMENTS

| 5,270,980 A | 12/1993 | Pathak et al. ........... 365/185.33 |
| 5,278,785 A | 1/1994 | Hazani ....................... 365/182 |
| 5,365,484 A | 11/1994 | Cleveland et al. .......... 365/218 |
| 5,406,521 A | 4/1995 | Hara ...................... 365/185.29 |
| 5,416,738 A * | 5/1995 | Shrivastava ................ 365/185 |
| 5,521,866 A * | 5/1996 | Akaogi .................. 365/185.29 |
| 6,118,705 A * | 9/2000 | Gupta et al. ........... 365/185.29 |

OTHER PUBLICATIONS

Kynett, et al., "A 90ns 100K Eras/Program Cycle Megabit Flash Memory", Session 10., Nonvolatile Memories, IEEE International Solid–State Circuits Conferences, Feb. 16, 1989, pp. 140–141.

Venkatesh, et al., "TP 2.7: A 55ns 0.35pm 5V–only 16M Flash Memory With Deep–Power–Down", ISSCC 96/Session 2/Flash Memory/Paper TP 2.7, 1996 IEEE International Solid–State Circuits Conference, pp. 44–45.

* cited by examiner

Primary Examiner—Huan Hoang
(74) Attorney, Agent, or Firm—Sierra Patent Group, Ltd.

(57) ABSTRACT

In a sector in a flash memory array PAGE ERASE and MULTIPLE PAGE ERASE modes of operation are provided. In the PAGE ERASE and MULTIPLE PAGE ERASE modes of operation, a preferred tunneling potential of approximately –10 Volts is applied to the gates of the flash memory cells on the row or rows being selected for erasure, and the bitlines connected to the drains of the flash memory cells are driven to a preferred voltage of approximately 6.5 Volts. To reduce the unintended erasure of memory cells in rows other than the selected row or rows, a preferred bias voltage of approximately 1 to 2 Volts is applied to the gates of all the flash memory cells in the rows other than the selected row or rows.

14 Claims, 3 Drawing Sheets

| | Xs | | X̄s | | Xd | | WL | | Vwg | Bit-Line | Array Source |
|---|---|---|---|---|---|---|---|---|---|---|---|
| | Select | Unselect | Select | Unselect | Select | Unselect | Select | Unselect | | | |
| READ | Vcc | 0V | 0V | Vcc | Vcc | 0V | "1" | "0" | 0V | To sense amplifier (For selected) | 0V |
| PROGRAM | 10V | 0V | 0V | 10V | 10V | 0V | 9V | 0V | 0V | 6.5V (For selected) | 0V |
| ERASE | Vcc | 0V | 0V | Vcc | 0V | Bias | −10V | Bias | Bias | 6.5V (All) | Float |

FIG. 3

PAGE MODE ERASE IN A FLASH MEMORY ARRAY

CROSS REFERENCE TO RELATED APPLICATIONS

This application is a divisional application of Ser. No. 09/042,244, filed Mar. 13, 1998, U.S. Pat. No. 6,118,705.

BACKGROUND OF THE INVENTION

1. Field of the Invention

The present invention relates to the erase mode in a flash memory array. More particularly, the present invention relates to a page erase mode and multiple page erase mode in a flash memory array.

2. The Prior Art

In a conventional flash memory array, the flash memory array is typically arranged as a matrix of wordlines and bitlines to form intersections with flash memory elements disposed at the intersections in a manner well known to those of ordinary skill in the art. The operations that may be performed on the memory cells in the flash memory array are READ, PROGRAM and ERASE.

The PROGRAM operation is often performed by driving selected bitlines connected to the drain region in the flash memory cells to a first voltage and driving the gates of the flash memory cells connected to selected wordlines to a higher voltage to perform hot electron injection in a manner well known to those of ordinary skill in the art.

The ERASE operation is performed by driving the gate of the flash memory cell to a voltage that is substantially less than a voltage placed on the bitline. In doing so, electrons are tunneled off of the floating gate of the flash memory cells in a manner well known to those of ordinary skill in the art. For conventional flash memory arrays, it is known that either the entire flash memory array may be erased at one time, known as BULK ERASE, or that a sector in the flash memory array may be erased at one time, known as SECTOR ERASE. An example of a BULK ERASE of a flash memory array is found in the paper "A 90 ns 100K Erase-Program Cycle Megabit Flash Memory", 1989, IEEE International Solid State Circuits Conference, pages 140 and 141, February 1989. An example of a SECTOR ERASE is found in the paper entitled, "A 55 ns 0.35 μm 5V Only 16M Flash Memory with Deep-Power-Down", 1996, IEEE International Solid-State Circuits Conference, pages 44 and 45, February 1996.

Constraining the ERASE operation to either a SECTOR or BULK ERASE is done in consideration of the fact that when individual row lines are selected to be erased, there is the possibility the value stored on the floating gate of flash memory cells for unselected rows will be affected due to the occurrence of unintended tunneling. Accordingly, it is an object of the present invention to provide an erase mode wherein only a single row in a sector or multiple rows in a sector may be erased while reducing the disturb phenomenon for flash memory cells in the sector that are not selected.

BRIEF DESCRIPTION OF THE INVENTION

According to the first aspect of the present invention, a PAGE ERASE mode of operation is provided for a sector in a flash memory array. In the PAGE ERASE mode of operation, a preferred tunneling potential of approximately −10 Volts is applied to the gates of the flash memory cells on the row being selected for PAGE ERASE, and the bitlines connected to the drains of the flash memory cells are driven to a preferred voltage of approximately 6.5 Volts. To reduce the unintended erasure of memory cells in rows other than the selected row, a preferred bias voltage of approximately 1 to 2 Volts is applied to the gates of all the flash memory cells in the rows other than the selected row.

According to a second aspect of the present invention, a MULTIPLE PAGE ERASE mode is provided. In the MULTIPLE PAGE ERASE mode, the rows in a sector are partitioned into groups, and more than one row in the group is selected to be erased or corresponding rows in different groups are selected to be erased. In MULTIPLE PAGE ERASE mode a preferred tunneling voltage of approximately −10 Volts to the gates of the flash memory cells in the rows selected for erasure, and the bitlines connected to the drains of the flash memory cells are driven to a preferred voltage of approximately 6.5 Volts. To reduce the occurrence of unintended erasure of flash memory cells on rows that are not selected, a preferred bias voltage of approximately 1 to 2 Volts is applied to the gates of the flash memory cells in rows that have not been selected for erasure.

BRIEF DESCRIPTION OF THE DRAWINGS

FIG. 3 illustrates a table of signals applied to elements in the sector illustrated in FIG. 2 for the READ, PROGRAM AND PAGE ERASE modes of a flash memory array according to the present invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
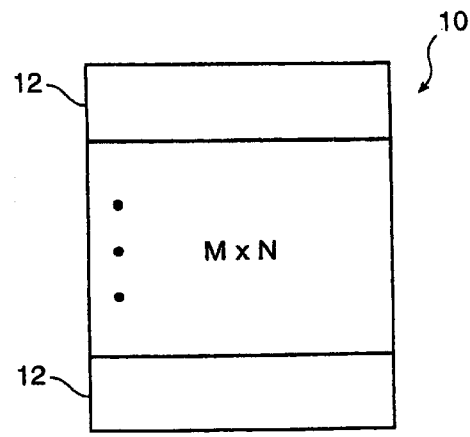
FIG. 1 illustrates a block diagram of flash memory array according to the present invention.

In FIG. 1, a flash memory array 10 according to the present invention is illustrated. The flash memory array 10 has M rows, wherein each row has N bytes. Each of the M rows in the flash memory array 10 is typically referred to as a page of memory. In the data flash memory array 10, the M rows are grouped into sectors or blocks in a manner well known to those of ordinary skill in the art. It will be appreciated that the number of rows included in a sector of the flash memory array 10 is typically a matter of design choice, and further that the entire flash memory array 10 may be considered as one sector. In a preferred embodiment of a 4 megabyte flash memory array, 2,048 rows (or pages) of 264 bytes each are grouped into 4 sectors containing 512 rows apiece.

As discussed above, there are typically three operations that can be performed on the memory cells in a flash memory array. These three operations are READ, PROGRAM, and ERASE. It has been known in the art to perform an erase of the entire flash memory array at once, known as a BULK ERASE, and to perform an erase of an entire sector, known as SECTOR ERASE. According to the present invention, an erase may be performed on a single row in a sector, known as PAGE ERASE, or on multiple pages in a sector known as MULTIPLE PAGE ERASE.

Figure 2:
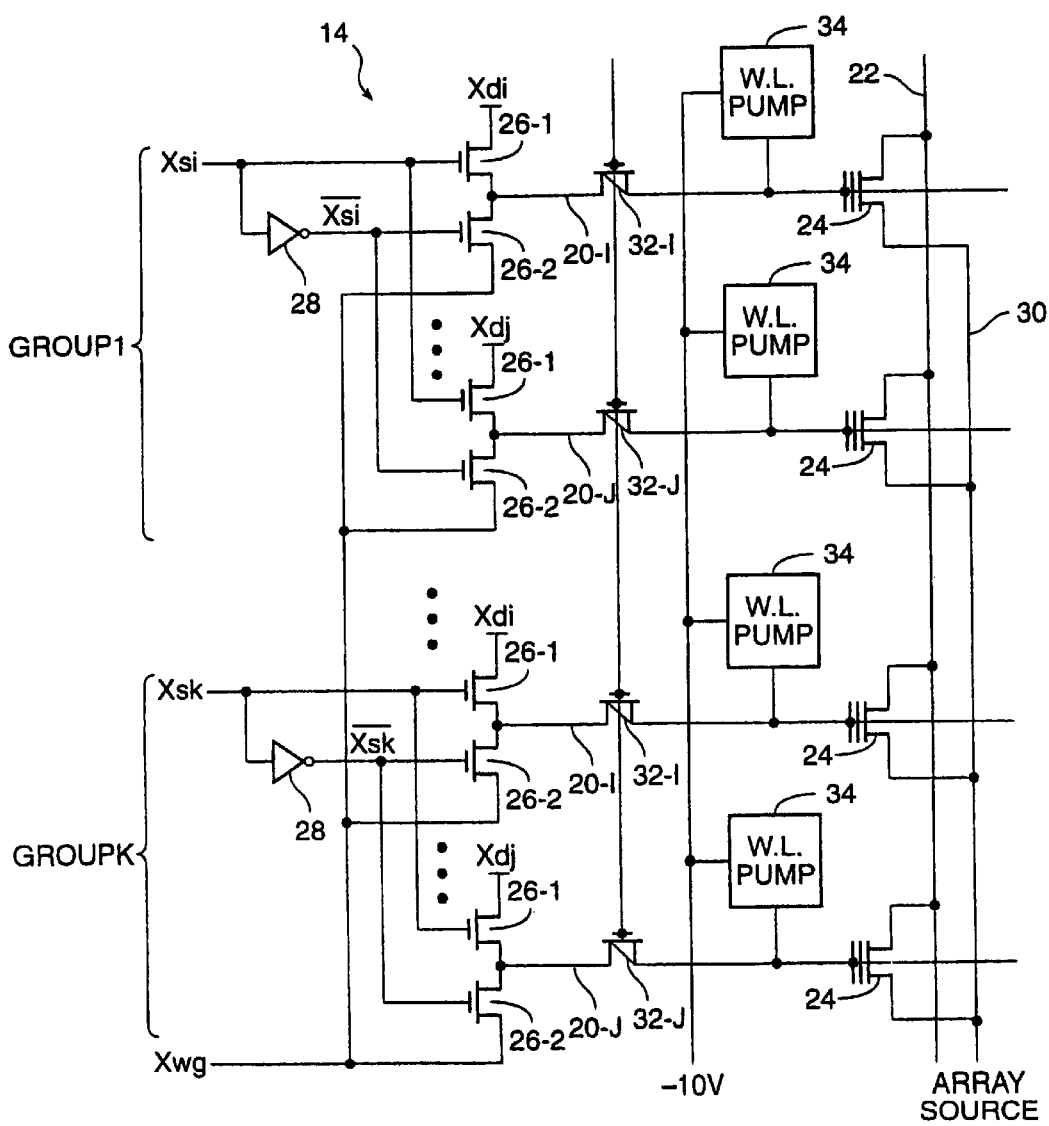
FIG. 2 illustrates a schematic diagram of a portion of a sector in the in the flash memory array of FIG. 1 according to the present invention.

Turning now to FIG. 2, a portion 14 of a sector 12 according to the present invention is illustrated. In the portion 14 of sector 12, the rows 20 are separated into K groups, wherein each of the K groups has J rows. In the preferred embodiment of the 4 megabyte flash memory array described above, the 512 rows in the sector are divided into 64 groups, wherein each of the 64 groups includes 8 rows. In the portion 14 of sector 12, a first group of rows 20-1 through 20-J is shown as Group 1, and a last group of rows 20-1 through 20-J is shown as Group K.

Each of the rows 20-1 through 20-J in the flash memory array 10 is a wordline as is well understood by those of ordinary skill in the art. Each of the word lines of rows 20-1 through 20-J form intersections with bit lines. Typically, the number of bitlines in the flash memory array is equal to the number of words in the row 20 multiplied by the number of bits in each word. For example, in the preferred embodiment of the 4M flash memory array described above, there are 264 words in each row and 8 bits in each word. As a result, there will be 2112 bit lines in the flash memory array. In the portion 14 of sector 12, a single bit line 22 is depicted for illustrative purposes.

Disposed at the intersections between the word lines 20 and the bit lines 22 are flash memory cells 24. A specific embodiment of a flash memory cell will not be described herein to avoid over complicating the disclosure, and thereby obscuring the present invention. A flash memory cell suitable for use according to the present invention is described in U.S. Pat. No. 4,783,766, filed May 30, 1986, assigned to the same assignee as the present invention, and incorporated herein by reference.

Connected to one end of each wordline 20 is a pair of N-channel MOS transistors 26-1 and 26-2. In each pair of N-channel MOS transistors 26-1 and 26-2, the drain of the first N-channel MOS transistor 26-1 is connected to a row selection potential, Xd, the source of the second N-channel MOS transistor 26-2 is connected to a gate bias potential Vwg, and the source and drain of first N-channel MOS transistor 26-1 and second N-channel MOS transistor 26-2, respectively, are connected to the word lines 20.

The gate of each N-channel MOS transistor 26-1 is connected to a group selection signal, Xs, and the gate of each N-channel MOS transistor 26-2 is connected to the compliment, $\overline{Xs}$, of the group selection signal, Xs, provided by inverter 28. It should be appreciated that the inverter 28 provides a voltage potential on $\overline{Xs}$ that is either higher or lower than the voltage on Xs by a desired amount. The group select signal, Xs, and its compliment, $\overline{Xs}$, are provided by a decoder, the implementation of which is well within the purview of those of ordinary skill in the art, and which will not be disclosed herein to avoid over complicating the disclosure and thereby obscuring the present invention.

For each of the flash memory elements disposed at the intersection of a wordline 20 and a bit line 22, the drain of the flash memory element is connected to the bit line 22, the source of the flash memory element 24 is connected to an array source voltage by an array source line 30, and the gate of the flash memory element 24 is connected to the word line 20. For each of the word lines 20, a P-channel MOS isolation pass transistor 32 is connected in series between each pair of N-channel MOS transistors 26-1 and 26-2 and the first flash memory element 24 disposed at the intersection of the wordline 20 and a bit line 22. Connected to the portion of each word line 20 disposed between P-channel MOS isolation pass transistor 32 and the gate of the first flash memory element 24 disposed at the intersection of the wordline 20 and a bit line 22 is a word line pump 34 connected to a source of negative voltage of about −15 volts to about −4 volts, and preferably −10 volts, by word line pump line 36.

Turning now to FIG. 3, a table indicating the signals applied to various elements in the circuit illustrated in FIG. 2 to implement the READ, PROGRAMMING and ERASE modes of the flash memory array according to the present invention are depicted. According to the present invention, only the application of the signals made during the ERASE operation will be described herein.

To select a particular row for PAGE ERASE, a Vcc voltage is applied on the group select signal line, Xs, to the gates of the N-channel MOS transistors 26-1 in the group containing the row 20-1 through 20-j being selected for PAGE ERASE, and a ground voltage (0 volts) is applied on the complement of the group select signal line, $\overline{Xs}$, to the gates of the N-channel MOS transistors 26-2 in the group containing the row 20-1 through 20-j being selected for PAGE ERASE. For the rows 20-1 through 20-j in groups other than the group having a row 20-1 through 20-j being selected for PAGE ERASE, a ground voltage (0 volts) is applied on the group select signal line, Xs, to the gates of the N-channel MOS transistors 26-1, and Vcc voltage is applied on the complement of the group select signal line, $\overline{Xs}$, to the gates of the N-channel MOS transistors 26-2.

As the voltages on the Xs and $\overline{Xs}$ group select signal lines are being applied, a ground voltage (0 volts) will be applied to the drain of the N-channel MOS transistor 26-1 of the row 20-1 through 20-J that is being selected for PAGE ERASE, and a bias voltage in the range of about 1 volt to about 5 volts and preferably of about 1 volt to about 2 volts will be applied to the drains of the rows 20-1 through 20-j that are not being selected for PAGE ERASE by the row select signal, Xd, and which are in the same group as row 20-1 through 20-j being selected for PAGE ERASE.

The ground voltage (0 volts) will also be applied to the drains of the N-channel MOS transistors 26-1 of the row 20-1 through 20-j in non-selected groups that correspond to the selected row 20-1 through 20-j, and that the bias voltage in the range of about 1 volt to about 5 volts and preferably of about 1 volt to about 2 volts will also be applied to the drains of the N-channel MOS transistors 26-1 for the rows 20-1 through 20-j in non-selected groups that correspond to the non-selected rows 20-1 through 20-j in the selected group.

For example, when the row 20-1 through 20-J being selected is row 20-2 in Group 1, then a ground voltage (0 volts) will be applied to the drain of the N-channel MOS transistor 26-1 of row 20-2, and also to the drains of the N-channel MOS transistors 26-1 of row 20-2 in groups 2 through K. Further, the bias voltage will be applied to the drains of the N-channel MOS transistors 26-1 of all rows 20-1, and 20-3 through 20-J in Group 1, and also to the drains of the N-channel MOS transistors 26-1 of all rows 20-1, and 20-3 through 20-J in Groups 2 through K.

In addition to the application of signals to the drains of the N-channel MOS transistors 26-1, when the voltages on the Xs and $\overline{Xs}$, group select signal lines are being applied, a bias voltage in the range of about 1 volt to about 5 volts and preferably of about 1 volt to about 2 volts is applied to the sources of N-channel MOS transistors 26-2 on the signal line Vwg.

When these voltages are being applied to the gates of N-channel MOS transistors 26-1 and 26-2, the drain of N-channel MOS transistor 26-1, and the source of N-channel MOS transistor 26-2, the P-channel MOS isolation pass transistors 32-1 through 32-j are turned on.

As a result, the ground voltage (0 volts) will be placed at the gates of the flash memory elements 24 in the selected row 20-1 through 20-J, and the bias voltage will be applied to the flash memory elements in all other rows 20-1 through 20-J. It should be appreciated from the above discussion that for the selected Group 1 through K containing the selected row 20-1 through 20-J, the bias voltage applied to the gates of the flash memory elements 24 in the non-selected rows 20-1 through 20-J in the selected Group is supplied on the Xd signal line connected to the drains of the N-channel MOS transistors 26-1, and that for all other rows 20-1 through 20-J in the nonselected Groups 1 through K, the bias voltage applied to the gates of the flash memory elements 24 is supplied by the voltage applied on the Vwg signal line to the sources of the N-channel MOS transistors 26-2.

Once the ground voltage (0 volts) has been applied to the gates of the flash memory cells 24 in the selected row 20-1 through 20-J and the bias voltage in the range of about 1 volt to about 5 volts and preferably of about 1 volt to about 2 volts has been applied to the gates of all other flash memory cells 24, a voltage to is applied to the gates of the P-channel MOS isolation pass transistors 32-1 through 32-J such that the P-channel MOS isolation pass transistor 32-1 through 32-J connected to the selected row 20-1 through 20-J is turned off due to the gate-to-source voltage. A negative voltage in the range of about −15 volts to about −4 volts and preferably of about −10 volts is applied to the selected row 20-1 through 20-J in the selected Group 1 through K by a word line pump 34 connected to the selected row 20-1 through 20-J.

To avoid over complicating the disclosure and thereby obscuring the present invention, an implementation of the word line pump 34 or other means for supplying the negative voltage to the selected row line 20-1 through 20-J well known to those of ordinary skill in the art will not be described herein. An implementation of a word line pump 34 suitable for use according to the present invention is described in U.S. Pat. Nos. 4,511,811, filed Feb. 8, 1982 and 4,673,829, filed Feb. 8, 1985, assigned to the same assignee as the present invention, and incorporated herein by reference.

Since the P-channel MOS isolation pass transistor 32-1 through 32-J connected to the selected row 20-1 through 20-J has been turned off, the negative voltage applied to the gates of the flash memory cells 24 in the selected row 20-1 through 20-J will not expose the N-channel MOS transistor pair 26-1 and 26-2 to negative voltage. Further, by first applying a ground voltage to the gates of the flash memory cells 24 in the selected row 20-1 through 20-J, rather than a bias voltage, less energy and time is expended by the word line pump 34 in supplying the negative voltage to the gates of the flash memory cells 24 in the selected row 20-1 through 20-J.

To complete the performance of the PAGE ERASE operation, the bit lines 22 are all driven to a positive voltage of about 5 volts to about 10 volts and preferably of about 6.5 volts. As a consequence, tunneling will occur between the floating gate and the drain of the flash memory cells 24 on the selected row 20-1 through 20-J in a manner well understood by those of ordinary skill in the art to ERASE the flash memory cells 24 on the selected row 20-1 through 20-J because a potential difference of about 12 to about 20 volts, and preferably about 16.5 volts has been placed between the drain and the floating gate the flash memory cells 24 on the selected row 20-1 through 20-J.

According to the present invention, when the positive voltage of about 5 volts to about 10 volts and preferably of about 6.5 volts is applied to the bit lines 22, the flash memory cells 24 on all of the non-selected rows 20-1 through 20-J will be less susceptible to tunneling because the bias voltage of about 1 volt to about 5 volts, and preferably about 1 volt to about 2 volts has been applied to the gates of the flash memory cells 24 on all of the non-selected rows 20-1 through 20-J.

It should be appreciated from the above discussion that a MULTIPLE PAGE ERASE may be performed on multiple pages in a selected Group by applying a ground voltage (0 volts) to the drains of each of the N-channels MOS transistors 26-1 of each of the multiple selected rows 20-1 through 20-J to place the ground voltage (0 volts) at the gates the flash memory cells 24 on all of the multiple selected rows 20-1 through 20-J. The word line pumps 34 connected to the multiple selected rows 20-1 through 26-J are then selected to place the negative voltage of about −15 volts to about −4 volts and preferably of about −10 volts at the gates the flash memory cells 24 on all of the multiple selected rows 20-1 through 20-J.

When the positive voltage of about 5 volts to about 10 volts and preferably of about 6.5 volts is applied to the bit lines 22 so that tunneling will occur between the floating gates and the drains of the flash memory cells 24 on the multiple selected rows 20-1 through 20-J in a manner well understood by those of ordinary skill in the art to ERASE the flash memory cells 24 on the multiple selected rows 20-1 through 20-J because a potential difference of about 12 to about 20 volts, and preferably about 16.5 volts has been placed between the drain and the floating gate the flash memory cells 24 on the multiple selected rows 20-1 through 20-J.

Figure 4:
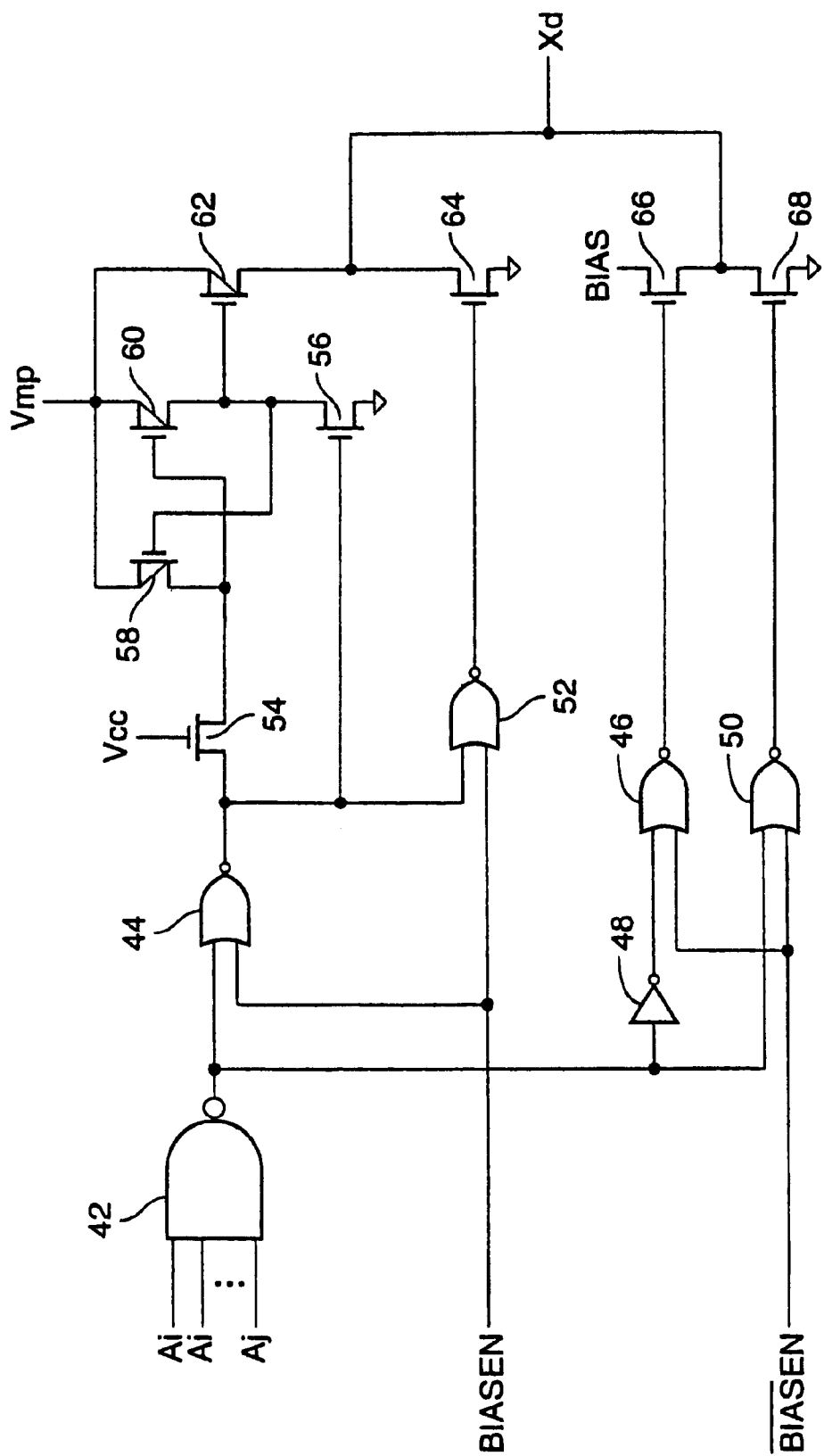
FIG. 4 illustrates a schematic diagram of variable reference generator circuit suitable for use according to the present invention.

Turning now to FIG. 4, a variable reference generator circuit 40 for providing the row select reference voltage, Xd, for the READ, PROGRAM AND ERASE modes is illustrated. in variable reference potential generator circuit 40, a NAND gate 42 has a plurality of inputs which decode whether a particular row 20-1 through 20-J in a group will be selected. The output of NAND gate 42 is connected to a first input of NOR gate 44, a first input of NOR gate 46 through inverter 48, and a first input of NOR gate 50.

A second input of NOR gate 44 is connected to a bias enable line that goes HIGH when the flash memory array is in an ERASE mode. The second inputs of NOR gates 46 and 50 are connected to the compliment of the bias enable signal. The output of NOR gate 44 is connected to a first input of a NOR gate 52, and a second input of NOR gate 52 is connected to the bias enable signal. The output of NOR gate 44 is also connected to the source of N-channel MOS pass transistor 54 and to the gate of N-channel pull-down transistor 56.

The gate of N-channel MOS isolation pass transistor 54 is connected to an isolation control signal, that is preferably Vcc. A variable voltage reference potential, Vmp, is connected to the sources of P-channel MOS transistors 58, 60, and 62. The source of N-channel MOS transistor 56 is connected to ground. The gates of P-channel MOS transistors 58 and 62 are connected to the drain of N-channel MOS transistor 56, and the gate of P-channel MOS transistor 60 is connected to the drain of N-channel MOS isolation pass transistor 54 along with the drain of P-channel MOS transistor 58. The drain of P-channel MOS transistor 60 is also connected to the drain of N-channel MOS transistor 56. An N-channel MOS transistor 64 has its gate connected to the output of NOR gate 52, a source connected to ground and a drain connected to the drain of P-channel MOS transistor 62 to form the output, Xd, of reference potential generator circuit 40.

The outputs of NOR gates 46 and 50 are connected to the gates of N-channel MOS transistors 66 and 68. The drain of N-channel MOS transistor 66 is connected to a BIAS potential, and the source of N-channel MOS transistor 68 is connected to ground. The source of N-channel MOS transistor 66 is connected to the drain of N-channel MOS transistor 68 to form a node that is connected to the output, Xd, of the reference potential generator circuit 40.

In the operation of the variable reference generator circuit 40, when the PAGE ERASE mode is being performed the bias enable signal is brought HIGH so that the output of NOR gates 44 and 52 will be LOW. The LOW signal passed by N-channel MOS transistor 54 to the gate of P-channel MOS transistor 60 will place the variable voltage Vmp on the gate of P-channel MOS transistor 62. The voltages of Vmp in the READ, PROGRAM, and PAGE ERASE modes are preferably Vcc, 10 volts, and Vcc, respectively. As such, the P-channel MOS transistor 62 will be turned off. The LOW signal provided by the NOR gate 52 to the gate of N-channel MOS transistor 64 will also turn off N-channel MOS transistor 64.

In the PAGE ERASE mode when the bias enable signal is brought HIGH, the complement of the bias enable signal connected to the NOR gates 46 and 50 is LOW. Also connected to the NOR gates 46 and 50 is the inverted output of NAND gate 42 and the output of NAND gate 42, respectively. A LOW output from NAND gate 42 indicates that this particular row 20-1 through 20-J is being selected. Accordingly, when a LOW output of NAND gate 42 is applied to NOR gate 50, the output, Xd, will be pulled to ground by N-channel MOS transistor 68 that is turned on by the output of NOR gate 50, and when a HIGH output of NAND gate 42 is applied as a LOW signal to NOR gate 46 by inverter 48, the output, Xd, will be pulled to the bias voltage by N-channel MOS transistor 66 that is turned on by the output of NOR gate 46.

During either the READ or PROGRAM modes, the bias enable signal will be LOW, and a LOW signal from NAND gate 42 will make the output of NOR gate 44 HIGH, and a HIGH signal from NAND gate 42 will make the output of NOR gate 44 LOW. When the output of NOR gate 44 is HIGH, the Vmp voltage will be placed at the output, Xd, through P-channel MOS transistor 62 that has been turned on when its gate is pulled to ground by the N-channel MOS transistor 56 that has been turned on by the HIGH signal from NOR gate 44. When the output of NOR gate 44 is LOW, the ground voltage will be placed at the output, Xd, through N-channel MOS transistor 64 that has been turned on by the HIGH signal from NOR gate 52.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a flash memory array organized in a plurality of rows and columns having a word line associated with each row of the array and a bit line associated with each column of the array, the memory including a plurality of memory cells, each memory cell associated with one row line and one column line of the array and including a transistor having a control gate coupled to the one of the row lines with which it is associated, a floating gate, a source coupled to a common source node for the memory array, and a drain coupled to the one of the bit lines with which it is associated, a method for performing an erase operation on one row of the array comprising:

applying a negative voltage to the row line associated with the row to be erased;

applying a positive bias voltage to the row lines in the array associated with rows other than said row to be erased; and applying a positive voltage more positive than said positive bias voltage to each bit line in the array, wherein the difference between said negative voltage and said positive voltage is of a magnitude sufficient to cause electrons to tunnel from said floating gate and wherein the difference between positive bias voltage and said positive voltage is of a magnitude such that said floating gate is less susceptible to tunneling.

2. The method of claim 1, wherein said flash memory array further includes a word line pump operatively coupled to said word line, and said act of applying said negative voltage is performed by said word line pump.

3. The method of claim 1, wherein said positive bias voltage does not exceed Vcc.

4. The method of claim 1, wherein said negative voltage is between about −15 volts and about −4 volts, said positive bias voltage is about 1 volts to 5 volts, and said positive voltage is about 5 volts to about 10 volts.

5. The method of claim 1, further including the act of floating said common source node.

6. In a flash memory including a plurality of memory cell transistors, each memory cell transistor having a control gate, a floating gate, a source, and a drain, a method for performing an erase operation on at least one memory cell transistor while not erasing other memory cell transistors, said method comprising:

applying a negative voltage to the control gate of the at least one memory cell transistor to be erased;

applying a positive bias voltage to the control gates of all memory cell transistors other than said at least one memory cell transistor to be erased; and applying a positive voltage more positive than said positive bias voltage to said drain of said at least one memory cell transistor to be erased and to the drains of said memory cell transistors not to be erased, wherein the difference between said negative voltage and said positive voltage is sufficient to cause electrons to tunnel from said floating gate of said at least one memory cell transistor not to be erased, and wherein the difference between said positive bias voltage and said positive voltage is of a magnitude such the floating gates of said memory cell transistors not to be erased are less susceptible to tunneling.

7. The method of claim 6, wherein said flash memory array further includes a word line pump operatively coupled to said word line, and said act of applying said negative voltage is performed by said word line pump.

8. The method of claim 6, wherein said positive bias voltage does not exceed Vcc.

9. The method of claim 6, wherein said negative voltage is between about −15 volts and about −4 volts, said positive bias voltage is about 1 volts to 5 volts, and said positive voltage is about 5 volts to about 10 volts.

10. The method of claim 6, further including the act of floating said common source node.

11. A flash memory array apparatus comprising:
a plurality of memory cell transistors, each memory cell transistor having a control gate, a floating gate, a source, and a drain;
means for applying a negative voltage to the control gate of at least one memory cell transistor to be erased;
means for applying a positive bias voltage to the control gates of all memory cell transistors other than said at least one memory cell transistor to be erased; and
means for applying a positive voltage more positive than said positive bias voltage to said drain of said at least one memory cell transistor to be erased and to said drains of said memory cell transistors not to be erased, wherein the difference between said negative voltage and said positive voltage is sufficient to cause electrons to tunnel from said floating gate of said at least one memory cell transistor not to be erased, and wherein the difference between said positive bias voltage and said positive voltage is of a magnitude such the floating gate of said memory cell transistor not to be erased is less susceptible to tunneling.

12. The apparatus of claim 11, wherein said means for applying a negative voltage to the control gate of at least one memory cell transistor to be erased includes a word line pump operatively coupled to said word line.

13. The apparatus of claim 11, wherein said positive bias voltage does not exceed Vcc.

14. The apparatus of claim 11, wherein said negative voltage is between about −15 volts and about −4 volts, said positive bias voltage is about 1 volts to 5 volts, and said positive voltage is about 5 volts to about 10 volts.

* * * * *